(12) United States Patent
Bradley

(10) Patent No.: US 7,183,333 B2
(45) Date of Patent: Feb. 27, 2007

(54) PHOTOINITIATED REACTIONS

(75) Inventor: Grant Bradley, Rochdale (GB)

(73) Assignee: Lintfield Limited, Lancashire (GB)

( * ) Notice: Subject to any disclaimer, the term of this patent is extended or adjusted under 35 U.S.C. 154(b) by 0 days.

(21) Appl. No.: 10/343,782

(22) PCT Filed: Aug. 3, 2001

(86) PCT No.: PCT/GB01/03497

§ 371 (c)(1), (2), (4) Date: Jun. 20, 2003

(87) PCT Pub. No.: WO02/12350

PCT Pub. Date: Feb. 14, 2002

(65) Prior Publication Data

US 2004/0014833 A1    Jan. 22, 2004

(30) Foreign Application Priority Data

Aug. 4, 2000    (GB) ................. 0019251.8

(51) Int. Cl.
C08F 2/50 (2006.01)
G03C 1/73 (2006.01)
G03C 1/735 (2006.01)

(52) U.S. Cl. ............ 522/25; 522/26; 522/29; 522/48; 522/63; 430/280.1; 430/281.1; 427/510

(58) Field of Classification Search ........ 430/325–326, 430/269–295, 332–345; 522/15, 17, 18, 522/67, 33, 38, 44, 53, 46, 48, 169, 182

See application file for complete search history.

(56) References Cited

U.S. PATENT DOCUMENTS 4,026,705 A * 5/1977 Crivello et al. ......... 430/280.1
4,072,694 A * 2/1978 Brattesani ............... 549/450
4,795,766 A * 1/1989 Rutsch et al. ............ 522/44

(Continued)

FOREIGN PATENT DOCUMENTS

EP    0874282    10/1998

(Continued)

OTHER PUBLICATIONS

Shirai et al, "Photoacid and Photobase Generators: Chemistry and Applications to Polymeric Materials", Prog. Poly. Sci,. vol. 21, 1-18, 1996.*

(Continued)

Primary Examiner—Susan Berman
(74) Attorney, Agent, or Firm—Welsh & Katz, Ltd.

(57) ABSTRACT

Photoinitiated reactions especially in photopolymer technology, as well as photoinitiated colour forming reactions are achievable by applying a reactive substrate selected from a polymerisable and/or crosslinkable composition and a colour changing substance to a support, activating a latent photoinitiator applied with the reactive substance and subsequently exposing the reactive substrate with the resulting photoinitiator therein to photoreaction conditions wherein actinic radiation causes the substrate to undergo polymerisation and/or crosslinking or colour change respectively, the substrate being locally modified in its constitution as a result of its exposure to actinic radiation at least one stage of the method, so that the resulting polymerised and/or crosslinked composition or colour changed substance corresponds in its distribution on the support to the locations of the modification of the substrate.

41 Claims, 4 Drawing Sheets

U.S. PATENT DOCUMENTS

| | | | |
|---|---|---|---|
| 4,923,941 A * | 5/1990 | Bailey | 526/268 |
| 5,510,539 A * | 4/1996 | Berner et al. | 568/376 |
| 5,998,495 A | 12/1999 | Oxman et al. | |
| 6,335,143 B1 | 1/2002 | Sumino | |
| 6,479,039 B1 * | 11/2002 | Dyer et al. | 424/61 |
| 6,482,565 B1 * | 11/2002 | Jung et al. | 430/270.1 |

FOREIGN PATENT DOCUMENTS

| | | |
|---|---|---|
| JP | 11269235 A * | 10/1999 |

OTHER PUBLICATIONS

LiBassi et al, "Photoinitiators for the Simultaneous Generation of Free Radicals and Acid Hardening Catalysts", Radcure 1986 Proceedings, Dec. 1987.*

Bradley G et al: "Photoinitiated polymerization reactions: application of a new real-time FTIR system for following the rate of polymerization" Journal of Photochemistry and Photobiology, A: Chemistry., vol. 100, No. 1-3, 1996, pp. 109-118, XP000980306.

Davidson R S et al: "The photoinitiated polymerization of 4-methylene-1, 3-dioxolanes" Journal of Photochemistry and Photobiology, A: Chemistry., vol. 100, 1997, pp. 185-193, XP002200649.

Hiraguri Y et al: "Novel Synthesis of a Polyketone via Radical Ring-Opening Pymerization of 2, 2-Diphenyl-4-methylene-1, 3-dioxolane" Journal of the American Chemical Society, vol. 109, 1987, pp. 3779-3780, XP002200650 DC US the whole document.

Crivello et al.; "Photoinitiators for Free Radical Cationic & Anionic Photopolymerisation 2nd Edition," SITA Technology Ltd., 9 pgs.; 1998.

Mitchell, et al.; "A New High-Speed Photopolymerization System," *Journal of Imaging Science*, vol. 30 (5), Sep./Oct. 1988, pp. 215-217.

* cited by examiner

PHOTOINITIATED REACTIONS

FIELD OF THE INVENTION

This invention relates to photoinitiated reactions, for example curing and polymerisation reactions, and more particularly to UV curing used in photopolymer technology, as well as to photoinitiated colour forming reactions.

Within the growing realm of UV curing technology, one of the most important applications is in photo-imaging. Ever since the birth of photography, new and innovative ways of obtaining images by exposure to light have been explored. Even the silver halide process itself, which still forms the core of photography has undergone substantial change, as for example when the introduction of T-grain emulsions took place.

Although substantial improvements in photopolymer technology have been made over the last 20 years, the sensitivity of the processes is still very limited compared to the photosensitivity of the silver halide process. One of the major goals in photopolymer science is to approach the sensitivity of silver halide.

BACKGROUND OF THE INVENTION

Two basic methods of increasing photopolymer quantum yield beyond unity exist. The first of these is most familiar as the acrylate chemistry used in most commercial free radical U.V. cure systems. The approach here is that of the chain reaction. Any photon which is absorbed and becomes converted by the initiator moiety into a radical is capable of converting many polymerisable molecules very quickly. Thus the quantum yield for this process is high, but still not as high as that for silver halide.

The second basic form of photopolymer quantum yield enhancement is exemplified by the cationic U.V. curing systems. In this instance, the absorbed photon generates a catalytic monomer species which is capable of catalysing polymerisations, cross-linking, or even molecular cleavage. This technology has been described as capable of producing "living polymers" which will continue growing as long as substrate monomer molecules are still available. The reactions are, however, relatively slow compared to the chain reactions of the free radical process. Furthermore, although the quantum yield in terms of reacted molecules is theoretically near infinite, the slow reactions limit spatial resolution by reason of diffusion of active species out of the imaged area.

SUMMARY OF THE INVENTION

A limitation in terms of photopolymer imaging has always been the amount of time needed to deliver an adequate number of photons to the area to be imaged. The delivery of a large amount of random photons is easy. High powered lamps, simple reflectors and conveyor belts used in combination enable this aim to be achieved. For imaging, the light needs to be collimated and delivered in a controlled fashion. To collimate the light output from any lamp involves a substantial loss of intensity. The subsequent use of optical components and even photo tools serves to reduce the yield of available photons from even a very powerful lamp to a remarkably low level.

It is within this environment that the usage of lasers has developed. Although the amount of energy that a visible or U.V. laser will deliver is relatively low, the intrinsic collimation and the intensity of photons delivered at a given wavelength make the laser a useful light source. The use of computer guided beam manipulation in combination with mirrors enables one to eliminate photo tool usage, and further enhances the amount of photons available for the photochemistry.

Nevertheless, these improvements have been only incremental, and laser imaged photopolymer processes are still slow. The silver halide process achieves extreme quantum efficiency by virtue of the development step. The actual efficiency of the photochemistry is relatively low compared with chain reaction processes. It is only when the silver halide emulsion is developed that the remarkable autocatalytic development chemistry improves the quantum yield. Wherever silver has been produced, the silver available accelerates the development reaction, which in turn produces more silver. Thus a single photon can generate a great number of silver atoms and a very high quantum yield is obtained due to the propagation which occurs in the development process.

It is an object of this invention to increase significantly the efficiency of photochemical reactions used in particular in photopolymer imaging.

According to the present invention, there is provided a method of carrying out a photoinitiated reaction which comprises applying a reactive substrate selected from a polymerisable and/or crosslinkable composition and a colour changing substance to a support, activating a latent photoinitiator which contains a vinyl-substituted dioxolane ring and yields a ketone when activated and which has been applied with the reactive substrate and subsequently exposing the reactive substrate with the resulting photoinitiator therein to photoreaction conditions wherein actinic radiation causes the substrate to undergo polymerisation and/or crosslinking or colour change respectively, the substrate being locally modified in its constitution as a result of its exposure to actinic radiation at at least one stage of the method, so that the resulting polymerised and/or crosslinked composition or colour changed substance corresponds in its distribution on the support to the locations of the modification of the substrate.

An understanding of the above-described concept of autocatalytic development chemistry with silver halide emulsions has made it possible to establish that a similar approach might be viable in the field of photopolymer imaging. Although no autocatalytic reaction of similar nature has yet been commercially exploited, it has been found that a similar amplification step can be introduced within the photopolymer field.

While it is feasible to consider the inventive principle as applying also to colour compounds or chromophores per se, it is envisaged that the colour change will take place during a crosslinking and/or polymerisation process to enable areas at which reaction has taken place to be identified. Leuco crystal violet is an important chromophore in this respect (latent colour formers are generally termed "leuco dyes"). Other leuco dyes to which the inventive principle may be applied include leucoxanthene and leucofluorans.

CONCISE DESCRIPTION OF THE DRAWINGS

DETAILED DESCRIPTION OF SEVERAL EMBODIMENTS OF THE INVENTION

Figure 1:
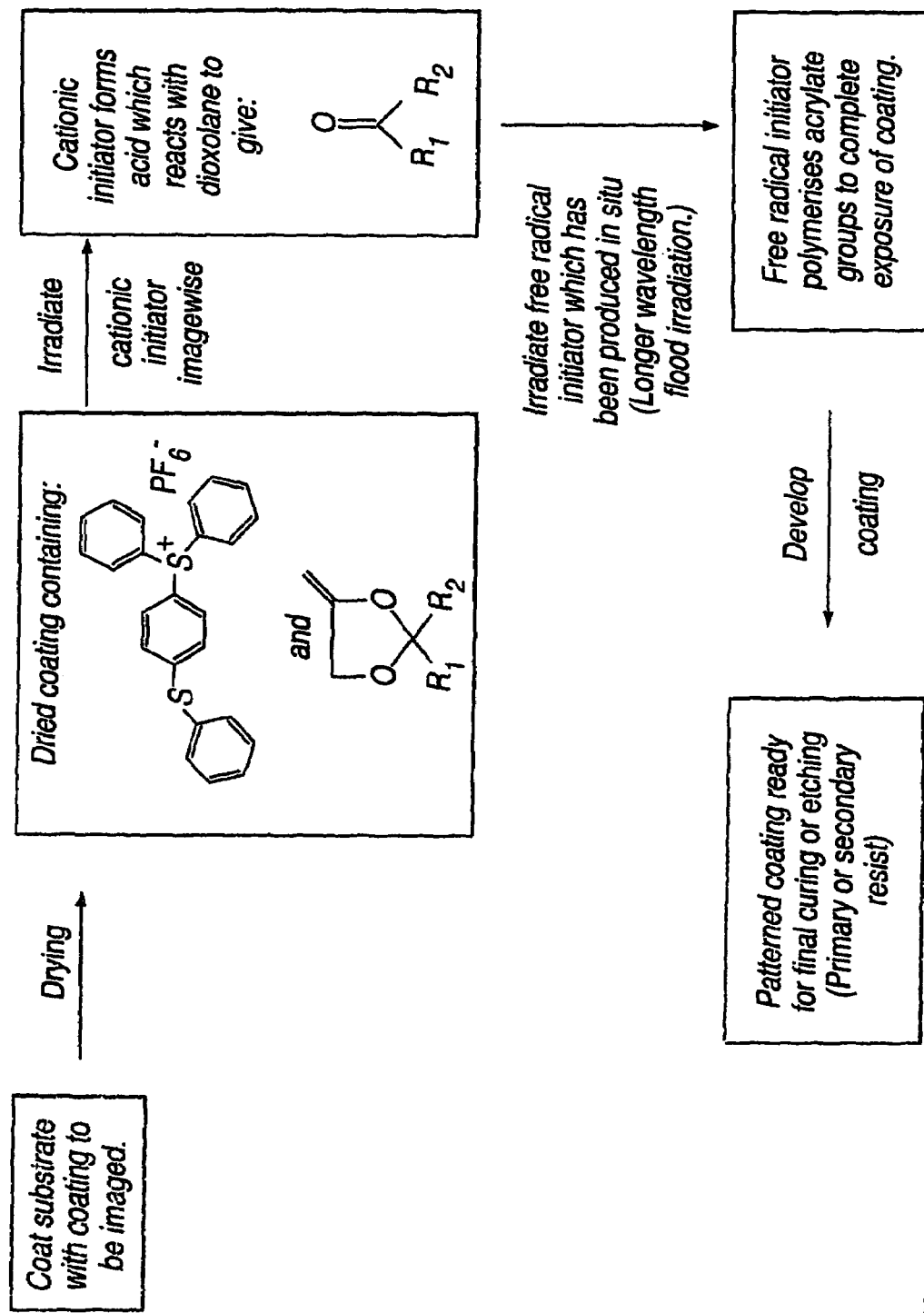
FIG. 1 is a flow scheme of a photopolymerisation method of the subject invention.

The latent photoinitiator is most commonly to be a protected photoinitiator whose protection is removed in a reaction which takes place under preliminary conditions. Such preliminary conditions preferably include the use of a photoinitiator as such which, when exposed to actinic radiation, is able to interact with the latent photoinitiator to cause the latent photoinitiator to be converted to its underlying photoinitiator. The present invention will, unless otherwise indicated, be described with reference to such a mode of activating the latent photoinitiator. There is then overall use of two photoreactions which will need to include application of actinic radiation at two distinct wavelengths. In particular a low energy source of actinic radiation may be employed in a first or preliminary photoreaction, which can be utilised in achieving an imagewise exposure of the substrate, and a high dosage of actinic radiation is applied as a flood in connection with a second photoreaction in which the substrate is polymerised and/or crosslinked. Preferably, laser direct imaging is used in applying the low energy source of actinic radiation.

Such method embodying this invention thus uses an amplification step, in which a second photochemical reaction is carried out subsequently to a preliminary, preferably photochemical reaction. Recent work has indeed been carried out by Bradley et al Journal of Photochemistry and Photobiology A: chemistry 100 (1996) 109–118, having been centred around the development of vinyl-dioxolane based monomers as a more amenable alternative to vinyl ethers conventionally used as monomers for cationic U.V. curing. Such a material is (2,2'-diphenyl-4-methylene-1,3-dioxolane):

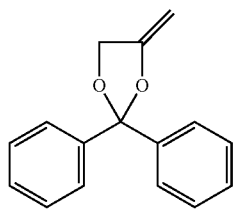

The vinyl dioxolane structure can be produced from a ketone photoinitiator starting material although other methods are available for the production of such a structure.

Experiments reported in the above reference demonstrated that the acid catalysed photopolymerisation using a cationic species and such vinyl-dioxolane does not proceed via a simple cationic polymerisation but rather occurs via a ROMP-like (Ring opening Metathesis Polymerisation) process in which a ketone is produced which is to act as photoinitiator in the second photoreaction.

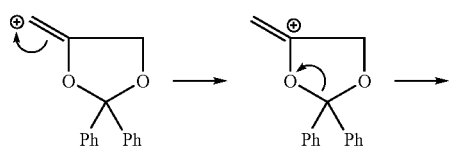

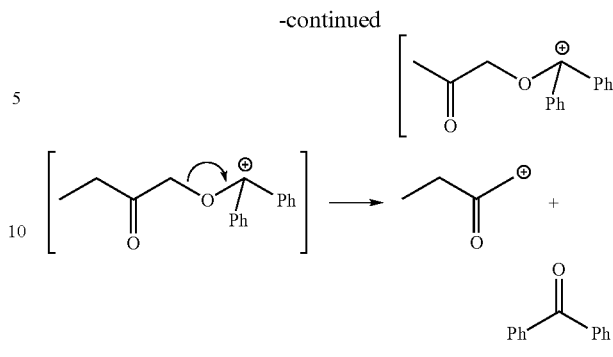

The vinyl-dioxolane behaves as a ketal-protected carbonyl compound and the process generates a polyketone as the dioxolane ring is opened, generating the theoretical parent ketone for the dioxolane ring. In the reported experiments, the ketone used was benzophenone, a well known photoinitiator of acrylate polymerisation.

It has similarly been found that the free radical polymerisation of the same compound results in the photogeneration of the theoretical parent ketone.

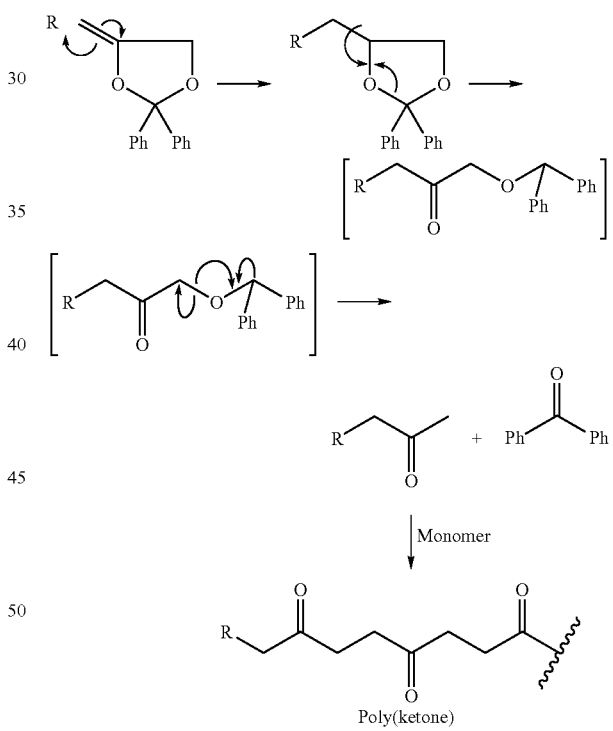

The dioxolane ring opening reaction is applicable to formation of a whole range of ketonic functional initiator and co-initiator species ranging from such simple well known materials as benzil dimethyl ketal through to exotic materials such as di-iodo butoxy fluorone (a visible active photoinitiator used for stereolithography). When made in the form of the required vinyl-dioxolanes, the resulting compounds act as "latent photoinitiators", capable of being activated by low doses of U.V. light on formation of catalytic quantities of acid from cationic initiators or by ongoing radical reactions. Examples of such compounds are:

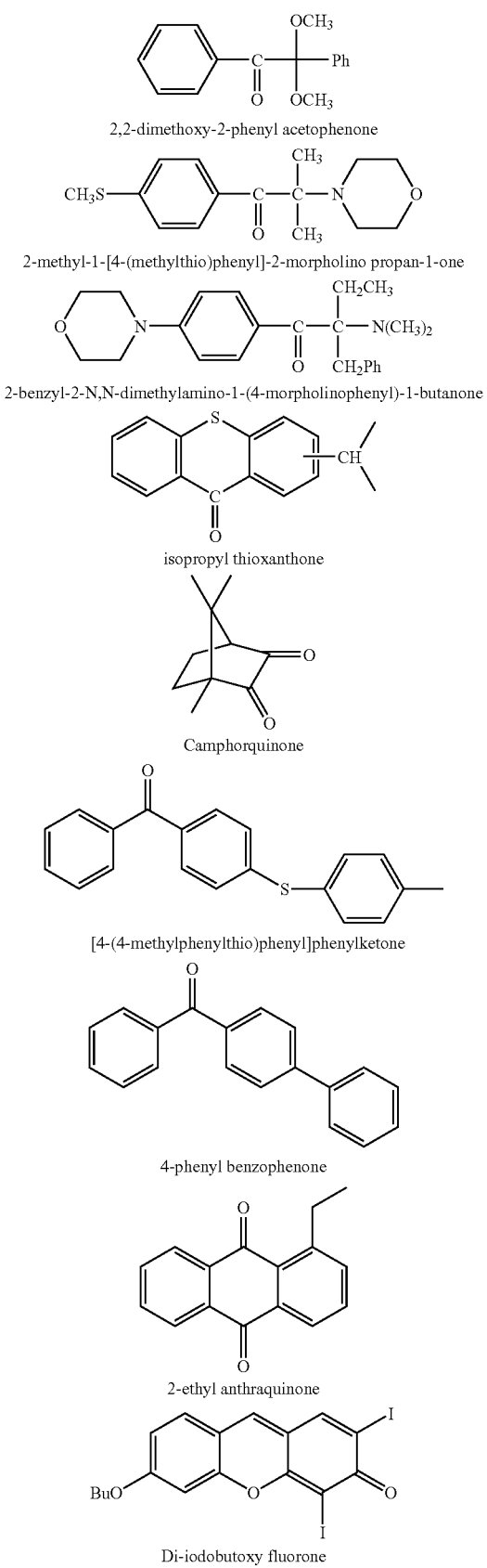

Other compounds which can be used are various benzoin ethers, as well as diethoxyacetophenone and 1-hydroxy-cycloxhexyl-phenyl ketone, and 2-hydroxy-2-methyl-1-phenyl-propan-1-one and ethers thereof.

Such enhanced photopolymerisation method embodying this invention typically involves an initial irradiation of a film containing a cationic (acid producing) photoinitiator, acrylate and vinyl-dioxolane based latent photoinitiator. This irradiation is fast and efficient, as the polymer formed in this step may be minimal and not cause any viscosity increase, which is a prime limit on reaction rates. Subsequent to the low energy image-wise exposure, the system can be flood irradiated with light of wavelength long enough to avoid further photolysis of the cationic initiator, but adequate to photolyse the initiator formed from the cleavage of the dioxolane ring. This irradiation is not image-wise and therefore can involve far higher dosages of light in a relatively short time. An application for this example is that of laser direct imaging of photoimageable coatings. The technology eliminates the bottleneck of having to deliver all the polymerisation energy via the laser in an imagewise fashion. An example of this technology is summarised in the flow scheme of FIG. 1 of the accompanying drawings.

Preferably in general, cationic acid-producing photoinitiators such as sulphonium and iodonium salts and salt-form orgonometallic compounds are utilised in achieving conversion of the latent photoinitiator although α-sulphonyloxy ketones can also be used as cationic acid-producing photoinitiators. These compounds are exemplified by the following compounds:

bis[4-(diphenylsulphonio)-phenyl]sulphide, bis-hexafluorophosphate or bis-hexafluoroantimonate optionally in combination with a mono-or-poly-[4-(phenylthiodiphenyl] sulphonium hexafluorophosphate or hexafluoroantimonate bis[4-(di(4-(2-hydroxyethyl)phenyl)sulphonio-phenyl] sulphide bis-hexafluorophosphate bis[4-(di(4-(2-hydroxyethyl)phenyl)sulphonio)-phenyl] sulphide bis-hexafluoroantinomate ($\eta^s$2,4-(cyclopentadienyl) [(1,2,3,4,5,6-$\eta$)-(methylethyl)-benzene]-iron(II)hexafluorophosphate 4-isopropyl-4-methyl diphenyliodonium or diphenyl iodonium hexafluorophosphate or tetra-(-penta-fluorophenyl)borate, as well as 2-hydroxy-2-phenyl-3-toluenesulphonyloxypropiophenone.

A wide range of formulations is possible. Generally, for the cationic acid-producing photoinitiator, the amount is in the range of from 0.25 to 3% by weight of the material to be acted on. For the latent initiator, the practical working range is from 3 to 10% by weight of the material to be acted on.

Whilst it is unlikely that this process will be able to completely match the silver halide process in terms of photosensitivity, nonetheless it permits products to be obtained which dramatically increase the productivity of imaging processes dependent on actinic radiation curing. Practical experience has shown that it is particularly convenient to work in the UV range. With vinyl-dioxolane latent photoinitiators and the aforementioned acid-producing producing photoinitiators, one can use UV-radiation of a relatively short wavelength in the first photochemical reaction and UV-radiator of a longer wavelength in the second photochemical reaction, or vice versa.

Figure 2:
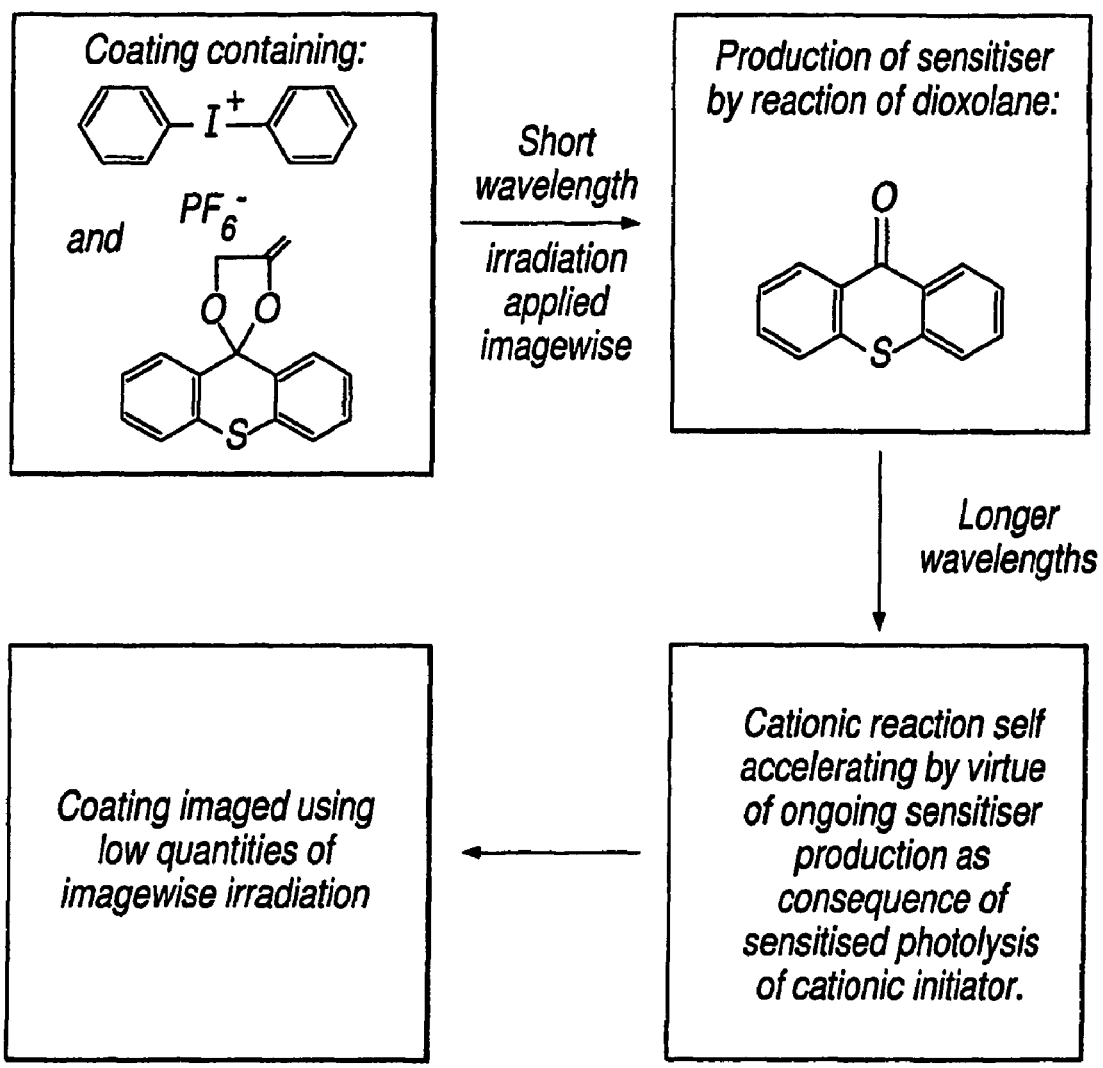
FIG. 2 is a flow scheme showing a second procedure embodying the subject invention.

A second procedure embodying this invention is in the field of photoimageable inks for sequential build up (SBU) technology where cationic systems are to be preferred due to their advantageous physical properties. This procedure demonstrates the versatility of the method of this invention. One of the materials which can be made in a dioxolane ring blocked form is isopropylthioxanthone (ITX). Thioxanthones are particularly suitable as sensitisers for iodonium salts. As the iodonium salts themselves are generators of acid catalysts for cationic polymerisation, the possibility of their being used in a self-sensitising system is apparent and provides a means of increasing quantum yields. Initial irradiation of the iodonium salt directly in an image-wise fashion results in production of a small amount of acid polymerisation catalyst. The resulting film is sensitive to an autoaccelerative reaction when flood irradiated with near visible radiation. This enhanced sensitivity opens the way for using laser direct imaging with photoimageable SBU dielectric. An example of this technology is summarised in the flow scheme of FIG. 2 of the accompanying drawings.

A third example of the same concept relies on the radical cleavage of the dioxolane. If a free radical initiator sensitive only to short wavelength light is formulated together with acrylic monomers, acrylic pre-polymers, and a latent initiator, the latent initiator being sensitive to longer wavelength, the resulting mixture can be exposed to give an autoaccelerating reaction.

Figure 3:
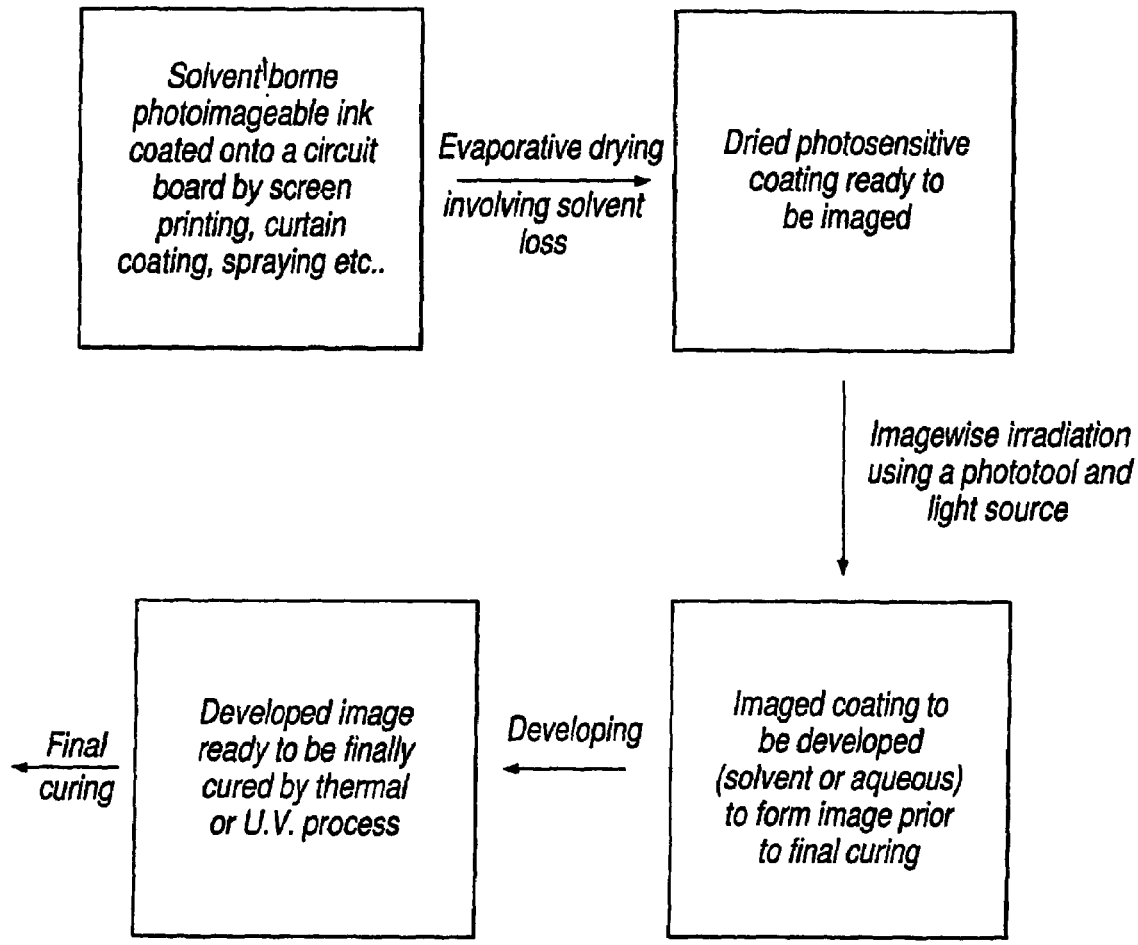
FIG. 3 is a flow scheme showing a third procedure embodying the subject invention.

Another example of the use of a latent photoinitiator is in the printed circuit board industry. As the volume of boards produced has increased dramatically, so have concerns over the environmental impact of board manufacturing processes, especially with regards to the emission of vapours which are difficult to contain or collect and reprocess. A process responsible for generating organic vapour emissions is the application, by various coating methods, of Liquid Photoimageable Solder Masks (LPISM). In this process the PCB is completely coated with a liquid formulation which can be dried in an oven to produce a photosensitive coating. Imagewise exposure of the coating and subsequent developing, either by aqueous carbonate or organic solvent allows formation of openings in the mask for purposes of component or connector placement. This technology is summarised in the flow scheme of FIG. 3 of the accompanying drawings.

In the face of increasingly stringent regulatory requirements, control technology to reduce or eliminate vapour emissions will become necessary. A few manufacturers have ventured to introduce water reducible LPISMs into the marketplace, but they appear to be technically inferior to traditional solvent based product.

Use of a photoacid generating initiator (cationic initiator) in conjunction with a dioxolane blocked acrylate initiator permits formulation of a 100% solids LPISM. This system has the advantage of producing no emissions. Such a 100% solids formulation which can be made tack-free on exposure to acid catalysis, but remains developable, can be made by following the teaching of the present invention. The LPISM thus produced can be U.V. dried, being heated to complete the solidification process and to ensure complete de-blocking. Subsequently it can be re-exposed to image the formulation and still be developed and finally cured in a fashion familiar to the industry. The use of dioxolane blocked latent photoinitiators preserves the radical initiator during the imaging step whilst the coating is U.V. dried.

A variety of approaches can be used to effect the U.V. drying. Vinyl ethers, cycloaliphatic epoxies and oxetane compounds can be used as polymerisable solvents. Alternatively, use of such materials as cross linkers for functionalised resins is viable. Use of reactive resins, and building resin molecular weight by cationic reaction can also be used. Finally, it is possible to use a vinyl ether functional resin and react it under cationic conditions with a hydroxy functional solvent, or vice versa. Such technology may be represented by the following:

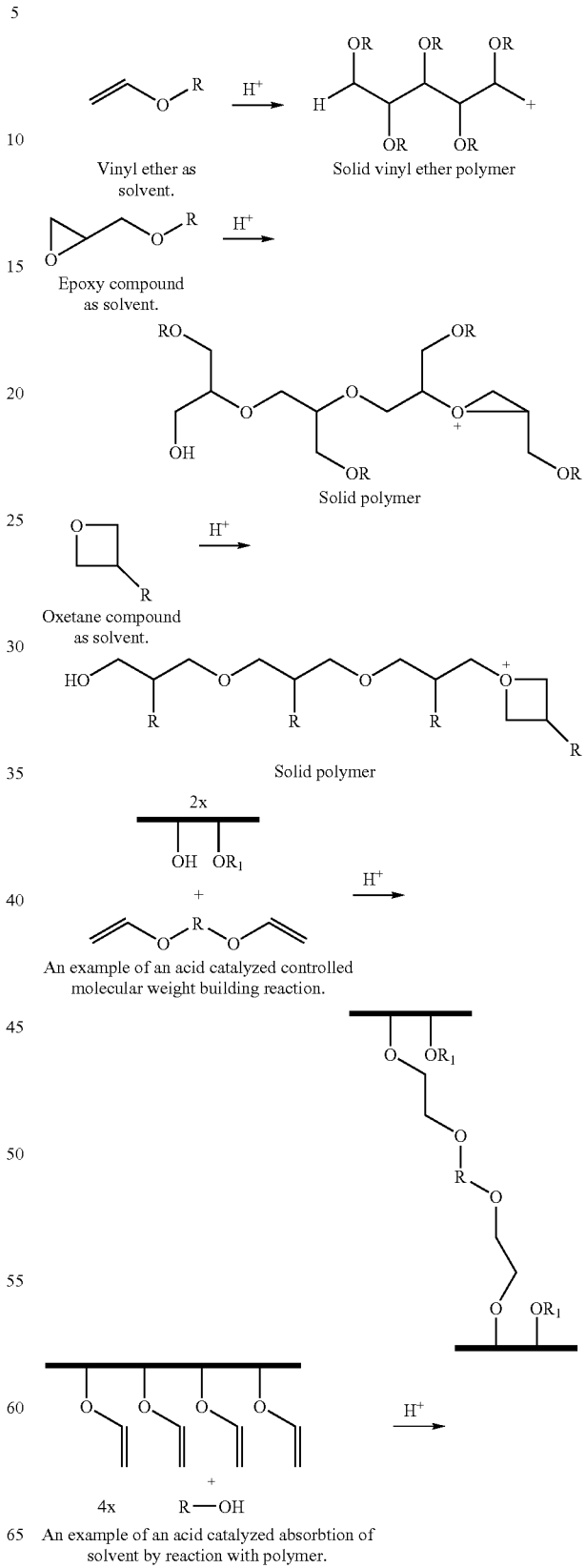

-continued

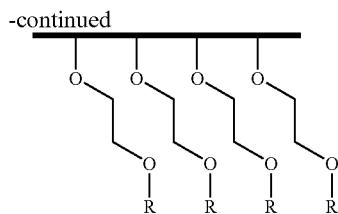

Figure 4:
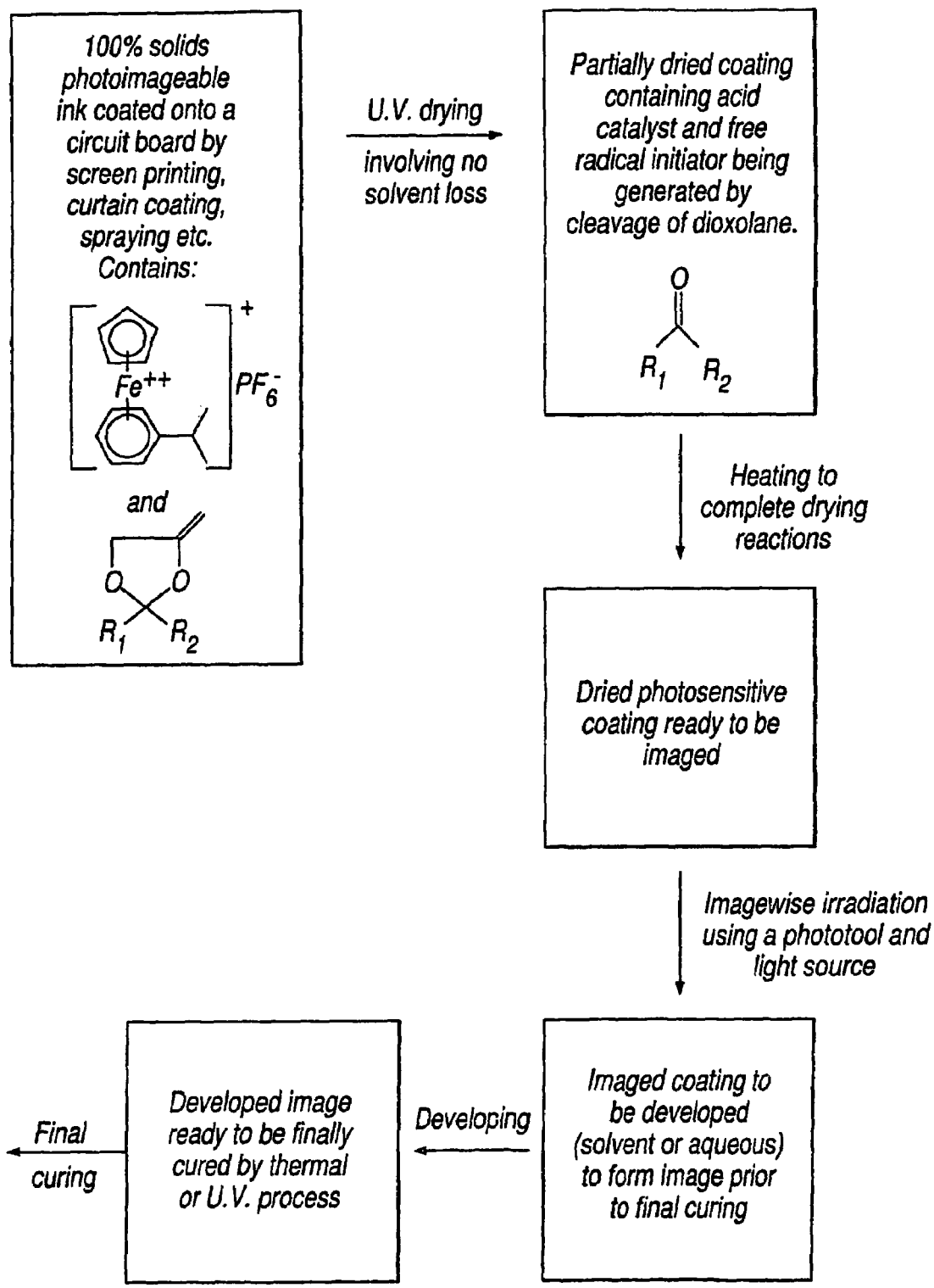
FIG. 4 is a flow scheme showing a fourth procedure embodying the subject invention.

The overall use of such LPISM technology is summarised by way of example in the flow scheme of FIG. 4 of the accompanying drawings.

Similar, applications are found in the manufacture of flexographic printing plates and other imaged printing systems.

As a further example, the technology can be applied to the field of visible active photoinitiators. The increased usage of these initiators means that many areas have to be configured as red light zones, these providing an exceedingly difficult environment to work in. Visible active formulations can be made with this technology so that they only become visible sensitive after U.V. irradiation. Substantial production and handling benefits ensue from this.

Yet another application is in conjunction with high intensity excimer lamp technology. The near monochromatic output of the excimer lamps would be easily capable of photolysing low concentrations of short-wavelength sensitive cationic initiators in very thick clear films.

A low concentration of any initiator, whilst necessary for controlling optical density in thick coatings, is not normally adequate to effect polymerisation. Thus the curing of thick films is limited to certain initiators which undergo photobleaching e.g. acylphosphine oxides. With correct formulation, use of a low concentration of cationic initiator in conjunction with a dioxolane blocked free radical initiator results in the ongoing, in-situ formation of free radical initiator. Thus, because the dioxolanes are blue shifted with respect to their parent initiator, optical density can be controlled, only a small proportion of free radical initiator being produced at any one time. This, in conjunction with the cold running of these lamps, would enable the use of this latent initiator technology in a wide variety of fields.

The latent initiators described here are not confined to being unblocked by photochemical processes yielding acid moieties. Any blocked acid of sufficient strength, for example a blocked toluene sulphonic acid, especially p-toluene sulphonic acid, will, on unblocking, catalyse the breakdown of the dioxolane ring on the latent photoinitiators. Examples of such compounds which can be used are the thermally unblockable blocked superacids produced by King Industries. A thermal unblocking variant on this technology can be useful for a number of the examples given here, especially the 100% solids LPISM and the improved handling for visible initiated processes In summary, the chemistry outlined here provides for the synthesis of a deactivated photoinitiator by a prescribed synthetic method, for example by reaction of a carbonyl group to form a vinylic functionalised dioxolane ring, for example, by use of a leuco carbonyl group present in the form of a vinyl functionalised dioxolene ring as latent photoinitiator.

The technology is useful in the following applications.
1. Primary and Secondary imaging (PCB industry)
2. U.V. initiated sensitisation of visible initiators
3. Making visible active formulations easy to handle.
4. Controlling the cure of thick films.
5. Improving shelf life of U.V. curing formulations.

The following examples illustrate the preparation of dioxolanes which can be used in the method of this invention:

EXAMPLE 1

Synthesis of 2-phenyl-2'-[4-(4-methylphenylthio)phenyl]-4-methylene-1,3-dioxolane Into an apparatus consisting of a 500 ml round bottomed flask equipped with a Dean and Stark apparatus/condenser, were added the following materials: 25.37 g [4-(4-methylphenylthio)phenyl]phenyl ketone, 9.21 g (+/−)-3-chloro-1,2-propanediol, 0.25 p-toluenesulphonic acid monohydrate and 200 ml toluene. The reaction mixture obtained was heated to reflux under atmospheric pressure until the reaction was complete (water collected).

The resultant reaction mixture was cooled and washed with 200 ml molar sodium carbonate solution and then water. The organic layer was then dried over magnesium sulphate, rotary evaporated and distilled under reduced pressure.

The purified intermediate was taken and dripped into a refluxing solution of potassium t-butoxide (22 g) in tetrahydrofuran (50 g) contained in a 250 ml two necked round bottomed flask fitted with a dropping funnel and condenser. After adding the intermediate over a period of 1.5 hours the mixture was refluxed for a further hour. The resultant reaction mixture was extracted with ether, washed twice with water, dried over magnesium sulphate and rotary evaporated to leave a clear oil of the above captioned target substance.

EXAMPLE 2

Synthesis of di-vinyldiozolane derivative of camphorquinone

Into an apparatus consisting of a 500 ml round bottomed flask equipped with a Dean and Stark apparatus/condenser, were added the following materials: 37.4 g camphorquinone, 50 g (+/−)-3-chloro-1,2-propanediol, 0.2 g p-toluenesulphonic acid monohydrate and 300 ml benzene. The reaction mixture obtained was heated to reflux under atmospheric pressure until the reaction was complete (water collected).

The resultant reaction mixture was cooled and washed with 200 ml molar sodium hydrogen carbonate solution and then water. The organic layer was then dried over magnesium sulphate, rotary evaporated and distilled under reduced pressure.

The purified intermediate was taken and dripped into a refluxing solution of potassium t-butoxide (50 g) in tetrahydrofuran (200 g) contained in a 500 ml two necked round bottomed flask fitted with a dropping funnel and condenser. After adding the intermediate over a period of 2 hours the mixture was refluxed for a further two hours. The resultant reaction mixture was extracted with ether, washed twice with water, dried over magnesium sulphate and rotary evaporated to leave a clear oil of the above-captioned target product.

The invention claimed is:
1. A method of carrying out a photoinitiated reaction which comprises applying a latent photoinitiator having a methylene-1,3-dioxolane ring and a reactive substrate selected from the group consisting of a polymerisable composition, a crosslinkable composition, a colour changing substance and mixtures thereof to a support, activating said latent photoinitiator in a catalytic reaction to yield a ketone photoinitiator in selected locations on the support where activated and exposing the reactive substrate with the resulting ketone photoinitiator therein to subsequent photoreaction conditions wherein actinic radiation causes the substrate to undergo reactions in at least some of said selected locations on the support where the latent photoinitiator has been activated.

2. A method according to claim 1, wherein the latent photoinitiator is a methylene-1,3-dioxolane precursor of diphenyl ketone, 2,2-dimethoxy-2-phenyl acetophenone, diethoxyacetophenone, 1-hydroxy-cyclohexyl-phenyl ketone, 2-hydroxy-2-methyl-1-phenyl-propan-1-one, 2-methyl-1-[4-(methylthio)phenyl]-2-morpholinopropan-1-one, 2-benzyl-2-N,N-dimethylamino-1-(4-morpholinophenyl)-1-butanone, isopropyl thioxanthone, camphorquinone, [4-(4-methylphenylthio)phenyl]-phenylketone, 4-phenyl benzophenone, 2-ethyl anthraquinone or di-iodobutoxy fluorone.

3. A method according to claim 1, wherein the latent photoinitiator is employed in an amount of from 3 to 10% by weight of the substrate.

4. A method according to claim 1, wherein the methylene-1,3-dioxolane group on the latent photoinitiator is removed in a photoreaction which takes place under initial photoreaction conditions.

5. A method according to claim 4, wherein the initial photoreaction conditions include the presence of a cationic photoinitiator which yields an acid catalyst for the unblocking of the latent photoinitiator.

6. A method according to claim 5, wherein the initial photoreaction conditions includes the presence of an iodonium or sulphonium salt or a salt-form organometallic compound or an α-sulphonyloxyketone.

7. A method according to claim 6, wherein the cationic photoinitiator is selected from the group consisting of:
   bis[4-(diphenylsulphonio)-phenyl]sulphide; bis-hexafluorophosphate or bis-hexafluoroantimonate optionally in combination with a mono- or poly-[4-(phenylthiodiphenyl] sulphonium hexafluoro phosphate or hexafluoroantimonate;
   bis[4-(di(4-(2-hydroxyethyl)phenyl)sulphonio-phenyl] sulphide bis-hexafluorophosphate;
   bis[4-(di(4-(2-hydroxyethyl)phenyl)sulphonio)-phenyl] sulphide bis-hexafluoroantinomate;
   $\eta^s$-2,4(cyclopentadienyl) [(1,2,3,4,5,6-$\eta$)-(methylethyl)-benzene]-iron(II)hexafluorophosphate;
   4-isopropyl-4-methyl diphenyliodonium hexafluorophosphate;
   diphenyl iodonium hexafluorophosphate;
   4-isopropyl-4-methyl diphenyliodonium tetrakis-(penta-fluorophenyl)borate;
   diphenyl iodonium tetrakis-(penta-fluorophenyl)borate; and
   2'-hydroxy-2-phenyl-3-toluenesulphonyl-propiophenone.

8. A method according to claim 5, wherein the cationic photoinitiator is employed in an amount of from 0.25 to 3% by weight of the substrate.

9. A method according to claim 4, wherein the initial and subsequent photoreaction conditions include application of actinic radiation at two distinct wavelengths.

10. A method according to claim 9, wherein the exposed substrate attains an image by carrying out an imagewise exposure of the substrate composition to actinic radiation using a photomask after activation of the photoinitiator, said activation of the photoinitiator having been carried out under conditions such that the substrate does not undergo substantial polymerisation or substantial crosslinking.

11. A method according to claim 9, wherein a low energy source of actinic radiation is employed as part of the initial photoreaction conditions in achieving an image in selected locations and a high dosage of actinic radiation applied as a flood is comprised by the subsequent photoreaction conditions.

12. A method according to claim 11, wherein laser direct imaging is used in applying the low energy source of actinic radiation, to achieve thereby a predetermined distribution of reactive substrate to be polymerised and/or crosslinked in the subsequent photoreaction conditions.

13. A method according to claim 1, wherein the actinic radiation is ultraviolet-radiation.

14. A method according to claim 1, wherein the latent photoinitiator is thermally activated under initial conditions.

15. A method according to claim 14, wherein the initial conditions include the presence of an initiator compound which is thermally decomposable to yield an acid catalyst for the unblocking of the latent photoinitiator.

16. A method according to claim 15, wherein said initiator compound is a blocked p-toluene sulphonic acid.

17. A method according to claim 14, wherein the exposed substrate attains an image by carrying out an imagewise exposure of the substrate composition to actinic radiation using a photomask after activation of the photoinitiator, said activation of the photoinitiator having been carried out under conditions such that the substrate does not undergo substantive polymerisation or substantial crosslinking.

18. A method according to claim 1, wherein the substrate is an acrylate substrate.

19. The method of claim 1 wherein the step of activating said latent photoinitiator yields a ketone photoinitiator throughout the entire of said support.

20. The method of claim 1 wherein the step of activating said latent photoinitiator yields a ketone photoinitiator throughout only portions of said support.

21. The method of claim 1 wherein the step of exposing the reactive substrate to a photoreaction conditions includes exposing only portions of the reactive substrate to the photoreaction conditions.

22. The method of claim 1 wherein the step of exposing the reactive substrate to a photoreaction conditions includes exposing the entire reactive substrate to the photoreaction conditions.

23. A method for the photoinitiated polymerization of a polymerizable substrate applied to a support, comprising:
   (a) providing a coating composition on the support, which coating composition comprises the polymerizable substrate and a latent photoinitiator, wherein the latent photoinitiator is a ketone photoinitiator which is protected by a methylene 1,3-dioxolane structure;
   (b) deprotecting the protected ketone photoinitiator in selected locations of the coating composition on the support thereby to provide an active ketone photoinitiator in the coating composition at said selected locations; and
   (c) exposing the coating composition on the support to a source of actinic radiation whereby polymerization of the polymerizable material is initiated in said selected locations on the support.

24. A method according to claim 23, wherein in step (b), the protected ketone photoinitiator is deprotected by an imagewise exposure of the coating to a source of radiation capable of effecting deprotection of the protected ketone photoinitiator.

25. A method according to claim 24, wherein the imagewise exposure employs a photomask.

26. A method according to claim 24, wherein the source of radiation used for the imagewise exposure is a low energy source of actinic radiation.

27. A method according to claim 26, wherein in step (c) the coating is exposed to a high dosage of actinic radiation applied as a flood.

28. A method according to claim 27, wherein the imagewise exposure is composed of ultraviolet radiation of a first wavelength and the flood exposure is composed of a ultraviolet radiation of a second wavelength different from the first wavelength.

29. A method according to claim 23, wherein in step (c) the coating is exposed to a high dosage of actinic radiation applied as a flood.

30. A method according to claim 23, wherein the coating on the support further includes a cationic acid-producing photoinitiator which on exposure to a source of radiation yields an acid catalyst for the deprotection of the protected photoinitiator.

31. A method according to claim 30, wherein the cationic acid-producing photoinitiator is a iodonium or sulphonium salt or a salt-form organometallic compound or an α-sulphonyloxyketone.

32. A method according to claim 31, wherein the cationic photoinitiator is selected from;
bis[4-(diphenylsulphonio)-phenyl]sulphide bis-hexafluorophosphate or bis-hexafluoroantimonate optionally in combination with a mono- or poly-[4-(phenylthio-diphenyl] sulphonium hexafluoro phosphate or hexafluoroantimonate
bis[4-(di(4-(2-hydroxyethyl)phenyl)sulphonio-phenyl] sulphide bis-hexafluorophosphate
bis[4-(di(4-(2-hydroxyethyl)phenyl)sulphonio)-phenyl] sulphide bis-hexafluoroantinomate
$\eta^S$-2,4-(cyclopentadienyl) [(1,2,3,4,5,6-$\eta$)-(methylethyl)-benzene]-iron(II)hexafluorophosphate
4-isopropyl-4-methyl diphenyliodonium hexafluorophosphate;
diphenyl iodonium hexafluorophosphate;
4-isopropyl-4-methyl diphenyliodonium tetrakis-(pentafluorophenyl)borate; and
diphenyl iodonium tetrakis-(penta-fluorophenyl)borate; and
2'-hydroxy-2-phenyl-3-toluenesulphonyl-propiophenone.

33. A method according to claim 30, wherein the cationic photoinitiator is employed in an amount of from 0.25 to 3% by weight of the substrate.

34. A method according to claim 30, wherein the deprotected ketone photoinitiator is a sensitizer for the cationic photoinitiator used whereby a self-sensitizing and auto-accelerating system is obtained.

35. A method according to claim 30, wherein the protected ketone photoinitiator is a protected thioxanthone and the cationic acid-producing photoinitiator is an iodonium salt.

36. A method according to claim 23, wherein the coating on the support further includes a free radical initiator which on exposure to a source of radiation yields free radicals for the deprotection of the protected photoinitiator.

37. A method according to claim 23, wherein the coating on the support includes an initiator compound which is thermally decomposable to yield an acid catalyst for the deprotection of the protected photoinitiator.

38. A method according to claim 37, wherein said initiator compound is a blocked p-toluene sulphonic acid.

39. A method according to claim 23, wherein the polymerizable substrate is an acrylate substrate.

40. A method according to claim 23, wherein the ketone photoinitiator, after deprotection is selected from:
2,2-dimethoxy-2-phenyl acetophenone;
2-methyl-1-[4-(methylthio)phenyl]-2-morpholino propan-1-one;
2-benzyl-2-N,N-dimenthylamino-1-(4-morpholinophenyl)-1-butanone;
isopropyl thioxanthone;
camphorquinone;
[4-(4-methylphenylthio)phenyl]phenylketone;
4-phenyl benzophenone;
2-ethyl anthraquinone; and
di-iodobutoxy fluorine.

41. A method of carrying out a photoinitiated reaction which comprises applying a reactive substrate selected from the group consisting of a polymerisable composition, a crosslinkable composition, and a colour changing substance to a support, activating a latent photoinitiator which contains a methylene-1,3-dioxolane ring and yields a ketone photoinitiator when activated and which has been applied with the reactive substrate and subsequently exposing the reactive substrate with the resulting ketone photoinitiator therein to photoreaction conditions wherein actinic radiation causes the substrate to undergo reaction, the reactive substrate being locally modified in its constitution as a result of its exposure to actinic radiation in at least one stage of the method to result in an exposed substrate, the exposed substrate corresponding in its distribution on the support to the locations of the modification of the substrate.

* * * * *